(12) United States Patent
Moosburger et al.

(10) Patent No.: US 10,607,969 B2
(45) Date of Patent: Mar. 31, 2020

(54) MODULE FOR A VIDEO WALL WITH RETAINING PINS

(71) Applicant: OSRAM OLED GmbH, Regensburg (DE)

(72) Inventors: Jürgen Moosburger, Lappersdorf (DE); Frank Singer, Regenstauf (DE); Thomas Schwarz, Regensburg (DE); Alexander Martin, Sinzing (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/098,212

(22) PCT Filed: May 9, 2017

(86) PCT No.: PCT/EP2017/061003
§ 371 (c)(1),
(2) Date: Nov. 1, 2018

(87) PCT Pub. No.: WO2017/198492
PCT Pub. Date: Nov. 23, 2017

(65) Prior Publication Data
US 2019/0157247 A1 May 23, 2019

(30) Foreign Application Priority Data

May 17, 2016 (DE) .................. 10 2016 109 041

(51) Int. Cl.
*H01L 25/075* (2006.01)
*G09F 9/302* (2006.01)
(Continued)

(52) U.S. Cl.
CPC ........ *H01L 25/0753* (2013.01); *G09F 9/3026* (2013.01); *G09F 9/33* (2013.01);
(Continued)

(58) Field of Classification Search
CPC ...... H01L 33/54; H01L 33/62; H01L 25/0753
See application file for complete search history.

(56) References Cited

U.S. PATENT DOCUMENTS 5,836,676 A 11/1998 Ando et al.
6,224,727 B1 5/2001 Miyata et al.
(Continued)

FOREIGN PATENT DOCUMENTS

JP H01165182 A 6/1989

*Primary Examiner* — Quoc D Hoang
(74) *Attorney, Agent, or Firm* — Slater Matsil, LLP

(57) ABSTRACT

A module for a video wall is disclosed. In an embodiment a module includes a carrier, a plurality of components comprising at least one light-emitting structural element arranged on the carrier and an optical element, wherein the components are arranged at a prespecified lateral distance in relation to one another, wherein a retaining recess is formed between at least two components, wherein the retaining recess comprises at least two component recesses of two components which are arranged next to one another, wherein a retaining pin is fastened in the retaining recess, wherein the retaining pin is connected to the optical element, and wherein the optical element is configured to influence light irradiation onto the components and/or light emission from the components.

18 Claims, 7 Drawing Sheets

(51) Int. Cl.
  *H01L 33/58*   (2010.01)
  *H01L 33/54*   (2010.01)
  *G09F 9/33*    (2006.01)
  *G09F 27/00*   (2006.01)
  *H01L 33/62*   (2010.01)
  *H01L 33/48*   (2010.01)

(52) U.S. Cl.
  CPC ............ *G09F 27/008* (2013.01); *H01L 33/54* (2013.01); *H01L 33/58* (2013.01); *H01L 33/62* (2013.01); *H01L 33/486* (2013.01)

(56) References Cited

U.S. PATENT DOCUMENTS

| | | | |
|---|---|---|---|
| 2012/0218773 A1 | 8/2012 | Peiler et al. | |
| 2014/0353694 A1 | 12/2014 | Pang et al. | |
| 2016/0064615 A1* | 3/2016 | Hatano | H01L 33/52 257/88 |

* cited by examiner

MODULE FOR A VIDEO WALL WITH RETAINING PINS

This patent application is a national phase filing under section 371 of PCT/EP2017/061003, filed May 9, 2017, which claims the priority of German patent application 10 2016 109 041.7, filed May 17, 2016, each of which is incorporated herein by reference in its entirety.

TECHNICAL FIELD

The prior art discloses video walls which comprise a plurality of LED components, wherein one LED component is provided for one pixel. The LED component comprises a housing and at least one or more, in particular three, LED chips. For better visibility of the LED or for protection against incident sunlight, shading elements can be provided over the LED chips. Furthermore, the individual LED housings can comprise lenses in order to improve the emission properties of the LED chip.

SUMMARY OF THE INVENTION

Embodiments provide an improved module for a video wall.

One advantage of the described module is that improved fastening for the optical element is proposed. In this case, the optical element is fastened to at least one retaining pin in a retaining recess of the module. The retaining recess is formed between two components of the module. In this way, the optical element can be securely and reliably fastened between two components even when there is a low space requirement. To this end, a retaining recess is formed between two components, wherein the retaining recess is formed at least partially by two component recesses of the two modules. Therefore, the components can be used as mechanical fastening elements for the optical element. Owing to the creation of a mounting face in the housing intermediate space, the mechanical fixing of the optical element is more stable than in the case of only mounting on the surface. Plug-in mounting in the form of a press-fit can be released again by heating, for example. Therefore, in the event of damage to the module, subsequent work or repair is possible in a simple manner in comparison to mounting by adhesive bonding.

The retaining pins may be fastened in the retaining recesses in an interlocking or force-fitting manner depending on the selected embodiment. In this case, the retaining pins are, for example, plugged in or plugged in and adhesively bonded.

In one embodiment, the retaining recess extends from a top side of the module into the carrier. As a result, better mechanical fastening of the retaining pin is achieved.

In a further embodiment, the retaining recess is arranged in a corner region of four components which are adjacent to one another. In this case, the retaining recess is formed by at least the component recesses of the four components. Therefore, a retaining recess with a relatively large diameter can be provided even though each component comprises only a relatively small component recess. In addition, the configuration of the component recess in the corner region of a component can be produced in a simple and cost-effective manner.

In one embodiment, the component recess is configured in the form of a bevel. The bevel can be made in the corner region with the aid of simple processes, such as drilling, lasering, sawing or grinding, for example, after the production of the component, for example.

In one embodiment, the carrier comprises a circuit board with electrical lines and/or electrical circuits. The components are arranged on the circuit board, wherein the retaining recess extends into a recess of the circuit board. Therefore, a circuit board can also be used in order to provide at least one part of the retaining recess.

In a further embodiment, the optical element comprises a plurality of retaining pins. In addition, a plurality of retaining recesses are provided in the module. The retaining pins are inserted into the retaining recesses. Furthermore, the optical element covers a plurality of, in particular all, components of the module. Depending on the selected embodiment, a plurality of individual optical elements, each with a retaining pin, could also be provided for one or more components, for example.

The use of an optical element with a plurality of retaining pins may improve the mechanical fastening of the optical element to the module. The retaining forces can be distributed with the aid of a plurality of retaining pins. In addition, relatively large optical elements can be fastened. In addition, the mechanical fastening of the optical element to the module using a plurality of retaining pins is more stable.

In one embodiment, the optical element comprises at least one shading element for at least one or more structural elements. The shading element is configured in order to reduce, in particular to suppress, irradiation of light, in particular of sunlight, onto the structural element. As a result, the color quality is improved, even in the event of light irradiation. Therefore, interfering effects owing to external light can be at least partially reduced. In addition to the shading function, the shading element can also comprise a reflective function depending on the selected embodiment.

In a further embodiment, the optical element comprises at least one radiation-guiding element for the electromagnetic radiation of the structural element. The radiation-guiding element can be configured, for example, in the form of a lens. Desired widening or narrowing of the emission angle of the structural element can be adjusted with the aid of the radiation-guiding element. For example, the emission behavior of the video wall in respect of width can be widened to the right or left. In addition, the emission behavior of the video wall in respect of height can be restricted at the top and at the bottom.

In one embodiment, the component comprises a plurality of structural elements, wherein one structural element comprises at least one light-emitting element. Depending on the selected embodiment, the individual structural elements of the component can be individually actuated. Corresponding electrical lines and control circuits are provided for this purpose.

In a further embodiment, the shading element is arranged in a manner inclined at an angle not equal to 90° with respect to a plane of the structural element. Improved shading of the structural element without significant impairment of light emission can be achieved in this way.

The shading element can be configured as a bent sheet-metal part, as a punched part or as a diecast part, in particular as a diecast MIM part (Metal Injection Molding). In a further embodiment, the shading element is formed from metal. For example, the shading element can also be formed from a metal grid, wherein in particular the retaining pins, a grid frame and the shading elements themselves are integrally formed from a metal plate, for example, by punching or cutting and by bending.

In a further embodiment, the radiation-guiding element is formed from plastic. In this case, the radiation-guiding element can be produced, in particular, from an injection-molded part. Forming the element from plastic allows for a robust and cost-effective radiation-guiding element. In addition, the production of the radiation-guiding element can be simplified with the aid of an injection-molded part.

With the aid of the retaining pins and the retaining recesses, the optical element comprises a precise position with respect to the components and the structural elements. Therefore, precise orientation of the optical element with respect to the components, in particular to the structural elements, can be achieved.

The described fastening of the optical structural element is appropriate, in particular, for modules of which the components are at a small lateral distance from one another. In this case, the lateral distances of the components can be formed in the region of from 0.8 mm or less, in particular less than 0.3 mm. Stable fastening of the optical element can also be achieved by way of retaining pins of which the diameter is smaller than one millimeter. Therefore, only a low level of shading and/or a low level of light scatter of the light emitted by the video wall is caused by the retaining pins.

A high pixel density of the video wall is achieved owing to the use of components with a plurality of structural elements which can each be individually actuated.

BRIEF DESCRIPTION OF THE DRAWINGS

The above-described properties, features and advantages of this invention and also the way in which these are achieved will become clearer and more distinctly understandable in association with the following description of the exemplary embodiments, which are explained in more detail in conjunction with the drawings, in which.

DETAILED DESCRIPTION OF ILLUSTRATIVE EMBODIMENTS

Figure 1:
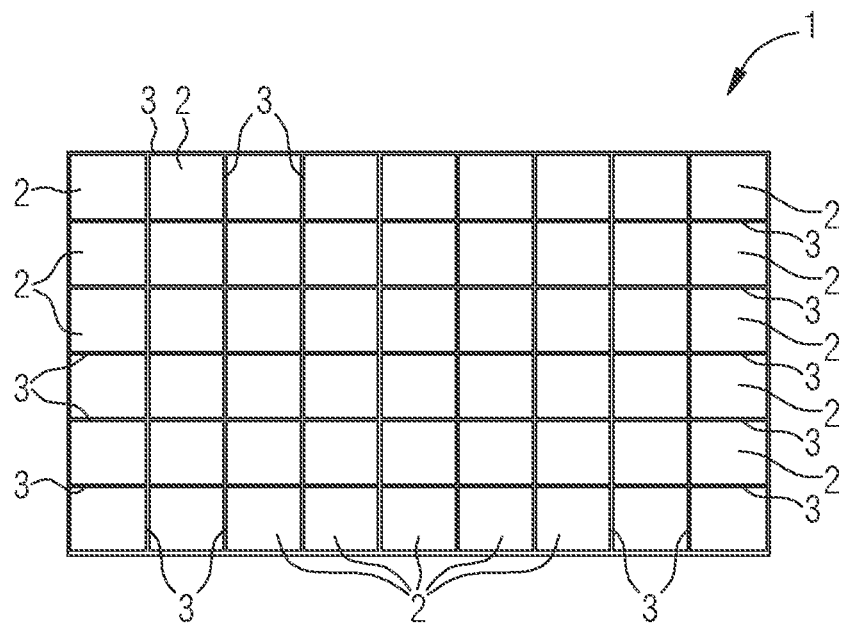
FIG. 1 shows a schematic plan view of a video wall without an optical element.

FIG. 1 shows a schematic plan view of a partial detail of a video wall 1 with a module which has a plurality of components 2. A video wall 1 can comprise one or more modules. In the illustrated exemplary embodiment, the components 2 are of square configuration and arranged in a uniform grid. Each component 2 comprises at least one light-emitting structural element. The light-emitting structural element can be configured, for example, as a light-emitting diode or as a laser diode. Trenches 3 are provided between the components 2, said trenches being filled, for example, with a filling material, in particular with a dark, in particular black, plastic. The term 'light' is understood to mean any type of electromagnetic radiation, in particular visible light or infrared light.

Figure 2:
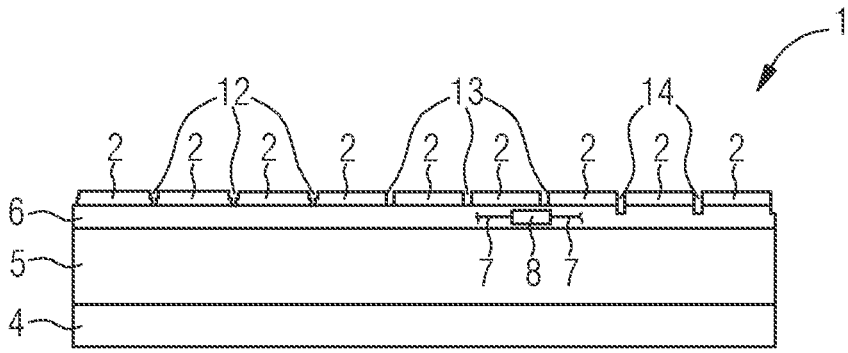
FIG. 2 shows a schematic cross section through the video wall with retaining recesses which are designed differently by way of example.

FIG. 2 shows a schematic illustration of an enlarged partial cross section through the video wall 1 of FIG. 1. The module of the video wall 1 comprises a mounting base 4 on which a module base 5 is arranged. The mounting base 4 can comprise retaining means for fastening the video wall 1, for example, to a building. The module base 5 can comprise mechanical fastening elements and plugs for electrically connecting the components 2, in particular the light-emitting structural elements. A circuit board 6 is arranged on the module base 5. The circuit board 6 can comprise electrical lines 7 and/or electrical circuits 8 for actuating the components 2. The components 2 are fastened on the circuit board 6. The components 2 can be fastened to the circuit board 6 by adhesive bonding, soldering or using other means. The trenches 3 are formed between the components 2. Depending on the selected embodiment, the trenches 3 can comprise a width in the region of 1 mm or less, in particular a width of less than 0.8 mm, in particular less than 0.3 mm. The small distance between the components 2 provides for a high component density and therefore a high luminosity of the video wall.

The circuit board 6, the module base 5 and the mounting base 4 constitute a carrier. Depending on the selected embodiment, the mounting base 4 or the module base 5 can be dispensed with. In addition, a circuit board 6 which comprises no electrical lines 7 and/or no electrical circuits 8 can also be provided.

Retaining recesses 12, 13, 14 are arranged between the components 2 in each case, wherein retaining designs, which are different by way of example, of retaining recesses 12, 13, 14 which extend to different depths into the plane of the components 2 or into the circuit board 6 are illustrated.

Depending on the selected embodiment, the retaining recess can extend only as far as a prespecified depth in the component plane 2, as shown by the first retaining recesses 12. The second retaining recesses 13 are of deeper configuration and extend to the top side of the circuit board 6. The third retaining recesses 14 extend to a defined depth into the circuit board 6. Depending on the selected embodiment, different depths of retaining recesses can therefore be used for fastening the retaining pins. In general, identical retaining recesses with identical depths are used in the case of a video wall 1.

Figure 3:
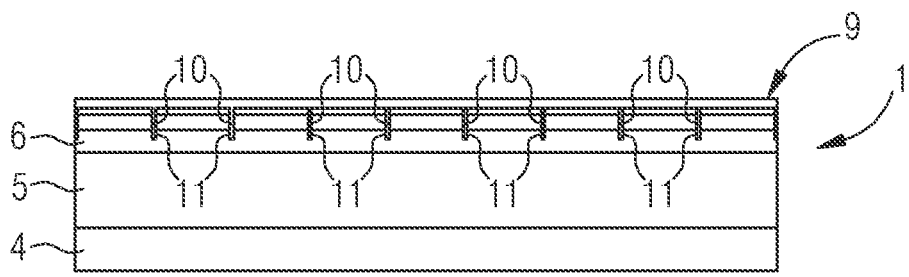
FIG. 3 shows a schematic cross section through the video wall with a mounted optical element.

FIG. 3 shows a schematic cross section through the arrangement of FIG. 2, wherein in this embodiment an optical element 9 is arranged over the components 2 however. In addition, the retaining recesses 11 comprise an identical depth. The optical element 9 is fastened to the video wall 1 with the aid of retaining pins 10. The retaining pins 10 are inserted into retaining recesses 11. In the illustrated embodiments, the retaining recesses 11 pass into the circuit board 6 starting from a top side of the components 2. The retaining recesses 11 are arranged in the region of the trenches 3. The optoelectronic element 9 is configured in order to influence light radiation onto the components 2, in particular onto the structural elements of the components 2. In addition, the optical element 9 can be configured in order to influence light emission of the components, in particular of the structural elements. The retaining pin 10 is fastened in the retaining recesses 11 in an interlocking or force-fitting manner. By way of example, the retaining pin 10 can be fastened in the retaining recesses 11 with the aid of an adhesive. The retaining pins 10 can comprise, for example, a diameter of less than 1 mm, in particular a diameter of less than 0.6 mm.

A module for a video wall comprises a plurality of components with at least one light-emitting structural element, which components are arranged on a carrier. The components are arranged at a prespecified distance in relation to one another. A retaining recess is formed between at least two components, wherein the retaining recess has at least two component recesses of components which are arranged next to one another. A retaining pin is fastened in the retaining recess, wherein the retaining pin is connected to an optical element. The optical element is configured in order to influence light irradiation onto the components and/or light emission from the components.

Figure 4:
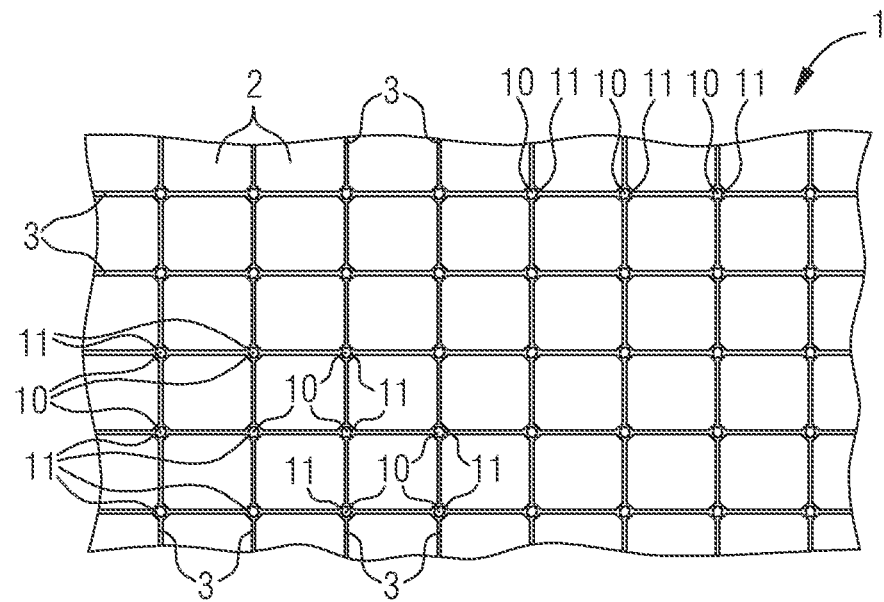
FIG. 4 shows a cross section through the arrangement of FIG. 3 looking at the video wall.

FIG. 4 shows a cross section through the arrangement of FIG. 3 which is arranged between the electrical element 9 and the components 2, looking at the components 2 of the video wall 1. In the illustrated embodiment, the retaining pins 10 are arranged in a corner region of the components 2 in each case. Therefore, the retaining recess 11 is also formed in the corner region of four components 2. In the illustrated design, a retaining recess 11 and a retaining pin 10 are arranged in each corner region of four components 2. Depending on the selected design, retaining recesses 11 and retaining pins 10 can be provided only at selected corner regions. In addition, the retaining recesses 11 and retaining pins 10 can also be arranged in other sections of the trenches 3, in particular between two components. The arrangement of the retaining recesses 11 and the retaining pins 10 in the corner region of the components 2 is only one of several possible designs.

Figure 5:
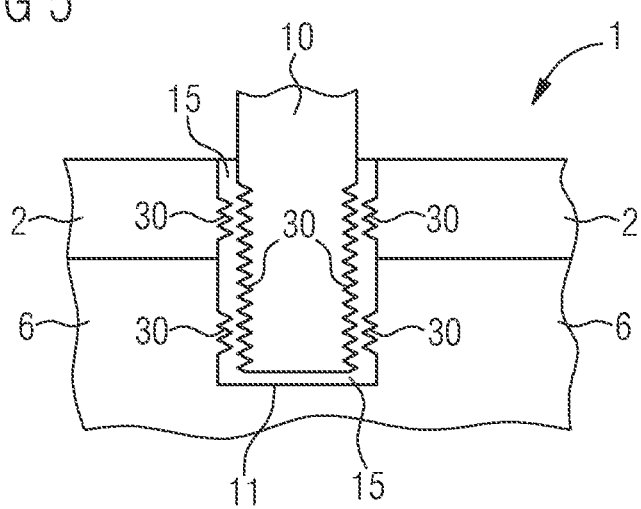
FIG. 5 shows a partial cross section through one embodiment of a retaining pin which is inserted into a retaining recess.

FIG. 5 shows a schematic partial cross section through a retaining pin 10 and a retaining recess 11. The retaining pin 10 and/or the retaining recess 11 can comprise mechanical structures 30, in particular edges, lugs or flutings in order to render possible improved mechanical fastening of the retaining pins 10 in the retaining recesses. In addition, the retaining pins 10 can be fastened in the retaining recesses 11 in an interlocking and/or force-fitting manner with the aid of a connecting layer 15, for example, an adhesive layer, a plastic layer or a solder layer.

Figure 6:
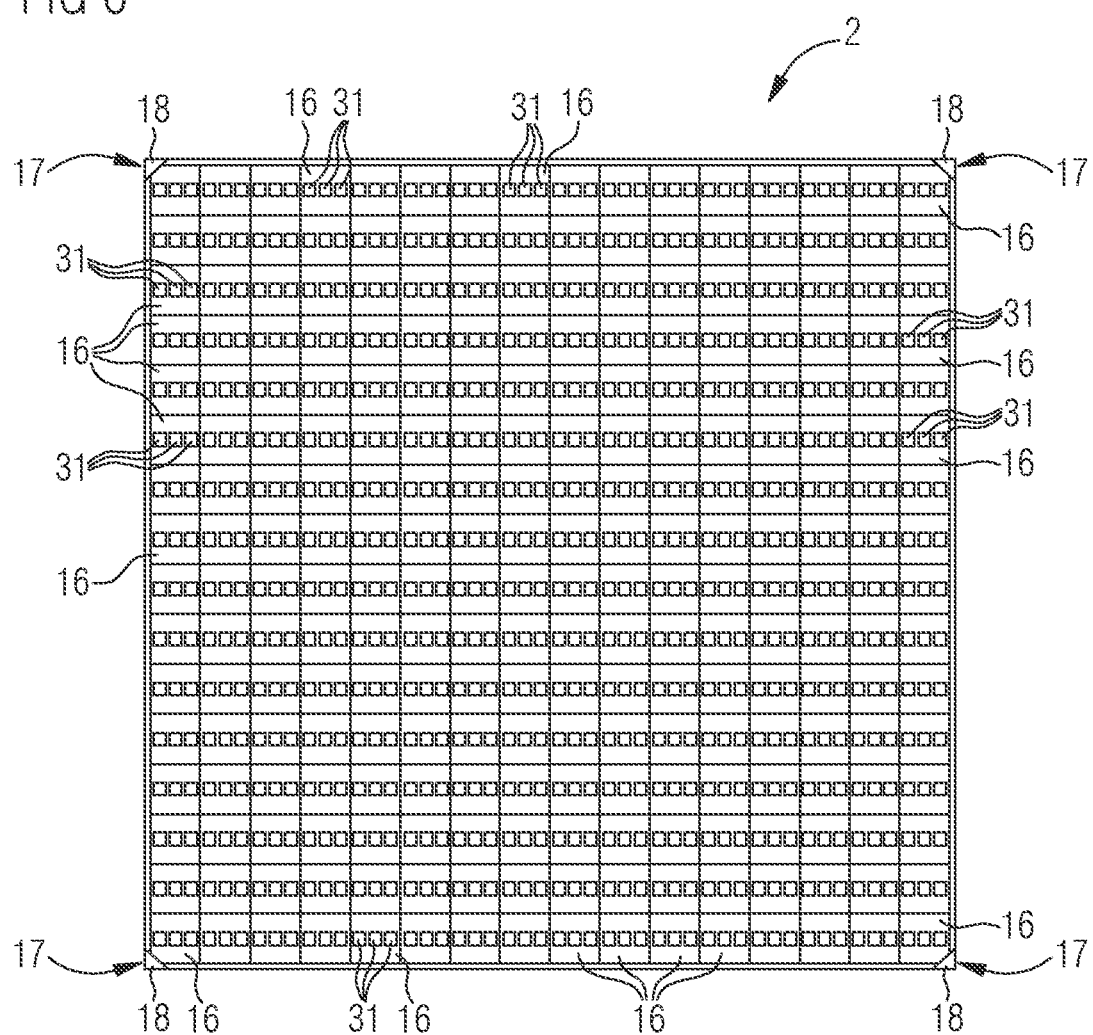
FIG. 6 shows an example of a component with a plurality of light-emitting structural elements.

FIG. 6 shows a schematic illustration of a plan view of a component 2. In the illustrated embodiment, the component 2 comprises a large number of structural elements 16. The structural elements 16 are of square configuration and arranged in a 16×16 grid. In the illustrated exemplary embodiment, one structural element 16 constitutes one image pixel. In the illustrated exemplary embodiment, one structural element 16 comprises three light-emitting elements 31 which are arranged in a row. Depending on the selected embodiment, the structural element 16 can also comprise more or fewer light-emitting elements 31. The light-emitting elements can be configured, for example, as light-emitting diodes or as laser diodes.

The component 2 constitutes a 16×16 multipixel LED housing. The component 2 comprises electrical lines and/or electrical circuits which render it possible to individually actuate each image pixel, that is to say each structural element 16. Depending on the selected embodiment, the component 2 can also comprise more or fewer structural elements 16. By way of example, the component 2 can be configured in the form of a 4×4 multipixel LED housing or in the form of a 32×32 multipixel LED housing. In the smallest embodiment, the component 2 comprises a single component 16 with a single light-emitting element 31.

In addition, the component 2 comprises in each case one component recess 18 in four corner regions 17. The component recesses 18 are configured in such a way that at least one portion of the component recess 18 forms a portion of a retaining recess 11. Depending on the selected embodiment, only one corner region 17 can comprise a component recess 18 or more than one corner region 17 can comprise a component recess 18 too. The component recesses 18 can comprise an extremely wide variety of forms. The component recesses 18 can be configured, for example, as bevels of the component 2.

Figure 7:
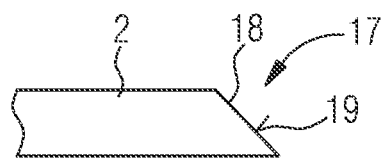
FIG. 7 shows a schematic cross section through a corner region of the component of FIG. 6.

FIG. 7 shows a schematic partial cross section through a corner region 17 of the component 2, wherein the cross section is arranged diagonally, that is to say centrally to the corner region 17. In the illustrated embodiment, the component recess 18 is configured in the form of a bevel, that is to say in the form of a face 19 which is arranged inclined at an angle. The inclination angle of the face 19 can be between 5° and 89°, in particular 45°. Depending on the selected embodiment, a portion of the base surface of the component 2 can be removed by the component recess 18.

Figure 8:
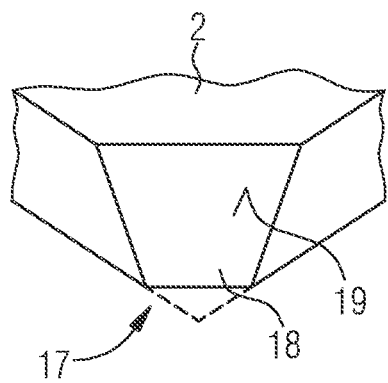
FIG. 8 shows a perspective schematic illustration of a corner region of the component of FIG. 6.

FIG. 8 shows a schematic perspective illustration of the corner region 17 of the component 2 with a component recess 18 in which a portion of the base surface of the component 2 is also removed. A removed base surface is indicated by dashed lines. The component recess 18 can be removed from the housing during production of the housing of the component 2 or afterwards, for example, with the aid of sawing or cutting methods or bores.

Figure 9:
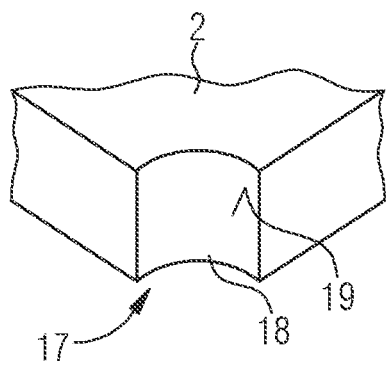
FIG. 9 shows a schematic perspective illustration of a corner region of a further embodiment of a structural element.

FIG. 9 shows a perspective illustration of a partial detail of a further component 2 with a corner region 17 in which the component recess 18 is configured in the form of a partially cylindrical shape.

Figure 10:
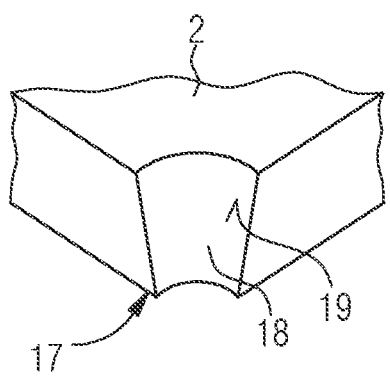
FIG. 10 shows a schematic perspective partial illustration of a corner region of a further embodiment of a component.

FIG. 10 shows a further embodiment of a component 2 in which the component recess 18 in the corner region 17 is configured in the form of a cylindrical recess which tapers conically toward the bottom.

The illustrated examples are not exhaustive, but rather the component recess 18 can also comprise other shapes too. In particular, the component recess 18 can be configured not only in the form of a partial cylinder but rather also with a rectangular partial cross section.

Figure 11:
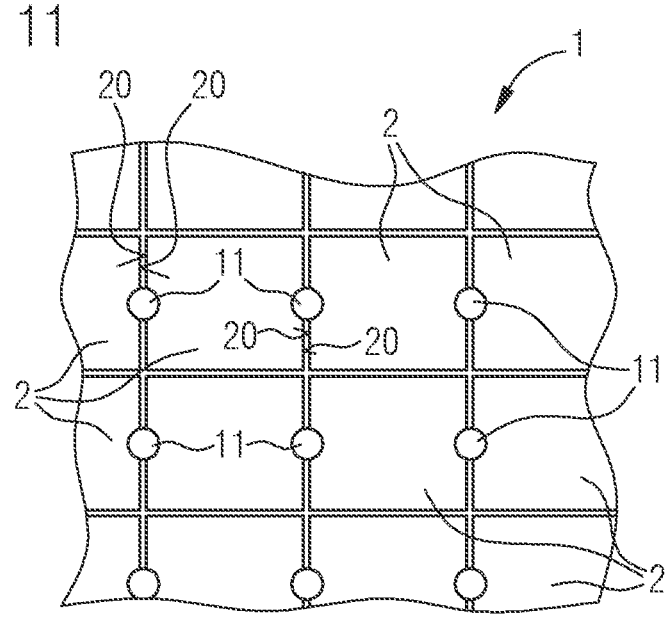
FIG. 11 shows a schematic partial illustration of a video wall with retaining recesses on side faces of the components.
Figure 12:
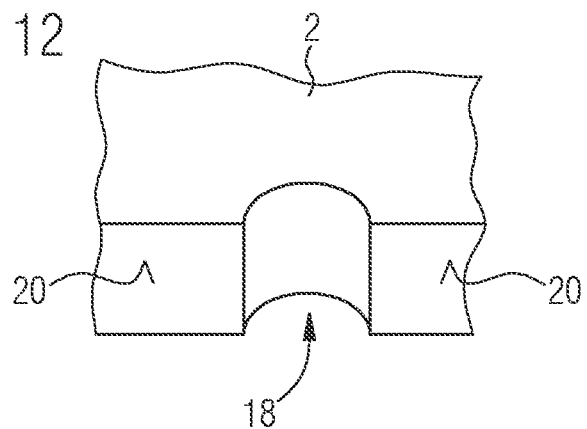
FIG. 12 shows a schematic perspective partial illustration of a component with a component recess along a longitudinal side of the component.

FIG. 11 shows a further embodiment of a video wall 1 in which, in contrast to the embodiment of FIG. 4, the retaining recesses 11 are not configured in the corner region of the components 2, but rather on side faces 20 of the components 2. In this embodiment, the retaining recess 11 is formed by two component recesses 18 of two components 2 which are situated beside one another. The component recesses can comprise an extremely wide variety of shapes and sizes. The retaining recesses 11 serve to receive retaining pins of an optical element. One possible form of the component recess 18 is schematically illustrated in FIG. 12. Depending on the desired embodiment, the component recess 18 can also have other cross sections, inclination angles, sizes etc.

Figure 13:
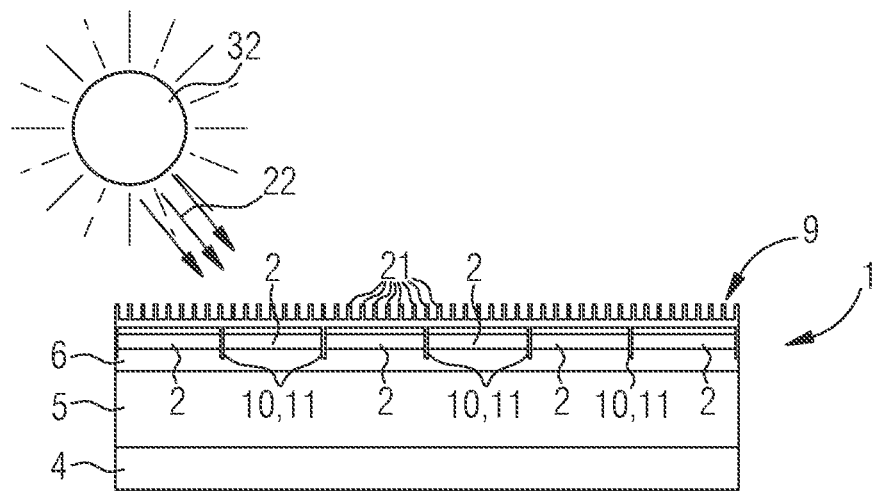
FIG. 13 shows a schematic illustration of a cross section through a further embodiment of a video wall with an optical element with shading elements.

FIG. 13 shows a schematic cross section through an embodiment which is constructed substantially in accordance with FIG. 3, wherein, however, the optical element 9 comprises shading elements 21. The shading elements 21 are provided in order to shade at least one component, in particular all components of the video wall, from light irradiation 22, in particular of the sun 32. The shading elements 21 are composed of an opaque material, for example, composed of metal or plastic.

Figure 14:
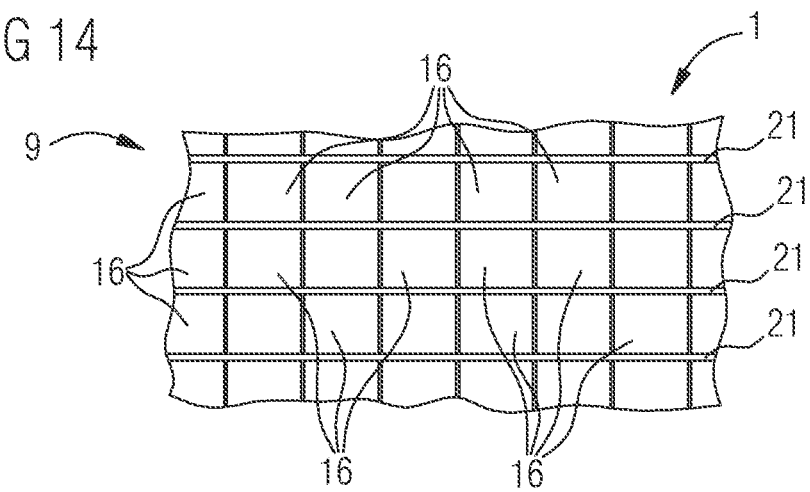
FIG. 14 shows a schematic partial detail of the arrangement of FIG. 13 looking from above.

FIG. 14 shows a partial detail of a plan view of the arrangement of FIG. 13. In this figure, the shading elements 21 are configured in the form of plates which are arranged parallel in relation to one another. The shading elements 21 are arranged parallel to a row of structural elements 16 in each case. Therefore, each structural element 16 and therefore each image pixel of the video wall 1 is shaded by a shading element 21. Depending on the selected design, other arrangements of the shading elements 21 can also be selected. By way of example, only each second structural element 16 could be shaded.

Figure 15:
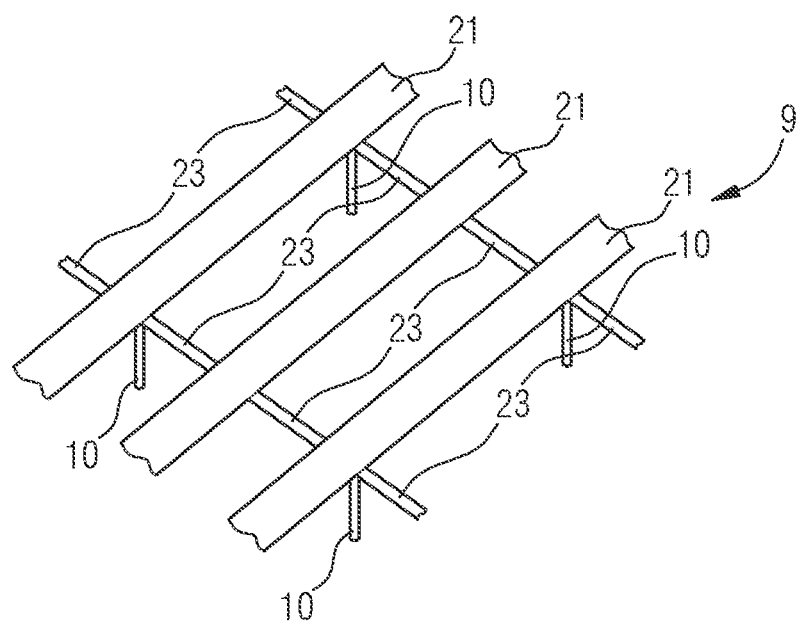
FIG. 15 shows a schematic perspective partial illustration of an optical element as illustrated in FIG. 13.

FIG. 15 shows a schematic perspective illustration of the optical element 9 of FIG. 13, wherein the shading elements 21 are connected to a carrier frame 23. In addition, the retaining pins 10 are fastened to the carrier frame 23. The carrier frame 23 connects the individual shading elements 21. In addition, it can be seen in said figure that the retaining pins 10 are arranged beneath a shading element 21 in each case. A stable configuration of the optical element 9 is achieved in this way. Instead of the carrier frame 23, a carrier plate which is transparent can also be provided, wherein the shading elements 21 are composed of an opaque material. The carrier frame can be composed, for example, of plastic or metal. In addition, the carrier frame 23 and the shading elements 21 and the retaining pins 10 can be integrally produced from a metal plate with the aid of punching and bending processes. To this end, for example, basic shapes for the shading elements 21 and basic shapes for the retaining pins are punched out of the metal plate. The shading elements 21 are then bent at the top and the retaining pins 10 are bent downward, wherein the carrier frame 23 remains in the plane of the metal plate and the retaining pins 10 and the shading elements 21 are integrally formed with the carrier frame 23. The carrier frame 23 can comprise, for example, a grid structure which is arranged parallel to the grid structure of the trenches 3. As a result, shading of the trenches 3 can be achieved.

Instead of a punching process, the carrier frame 23 and the shading elements 21 and the retaining pins 10 can be integrally produced from a metal plate with the aid of a cutting method, in particular with the aid of a laser-cutting method. To this end, for example, basic shapes for the shading elements 21 and basic shapes for the retaining pins are cut into the metal plate. The shading elements 21 are then bent at the top and the retaining pins 10 are bent downward, wherein the carrier frame 23 remains in the plane of the metal plate and the retaining pins 10 and the shading elements 21 are integrally formed with the carrier frame 23. The carrier frame 23 can comprise, for example, a grid structure which is arranged parallel to the grid structure of the trenches 3.

Figure 16:
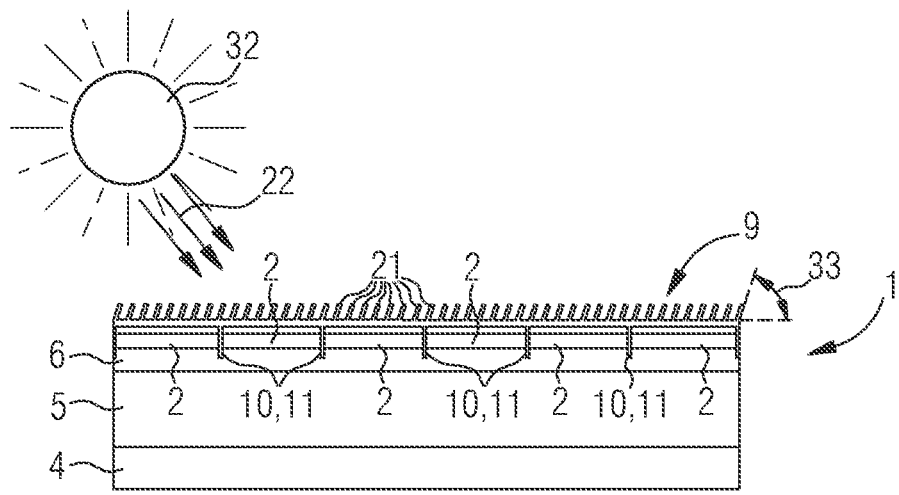
FIG. 16 shows a schematic illustration of a partial cross section through a video wall with an optical element with obliquely positioned shading elements.

FIG. 16 shows a schematic cross section through a further embodiment of a video wall 1 which is constructed substantially in accordance with FIG. 13, wherein in this embodiment, however, the shading elements 21 are arranged in a manner inclined at an angle 33 not equal to 90°, in particular at an angle of 80°, in relation to a plane of the components 2. Improved light irradiation from above, that is to say from the left in the illustrated design, can be achieved in this way. The angle 33 can lie, for example, between 89° and 45°.

Optimization between shading of external light, in particular of sunlight, and at the same time optimized visibility of the image pixels of the video wall can be achieved owing to the shading elements 21, arranged at an angle not equal to 90°, according to FIG. 16.

The optical element 9 in accordance with FIGS. 13 to 16 can be configured, for example, in the form of a metal grid. In this case, the shading elements 21 can be bent out of a metal plate. In addition, the retaining pins 10 can also be bent out of the metal plate. In addition, it is also conceivable to configure the optical element 9 with the aid of a metal diecast part or an MIM (Metal Injection Molding) part.

Figure 17:
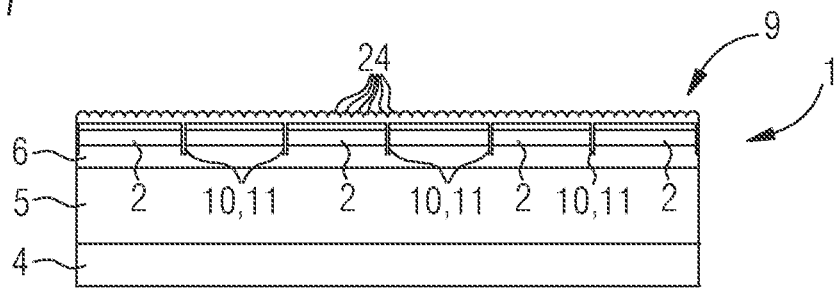
FIG. 17 shows a schematic partial cross section through a further embodiment of a video wall with a further optical element for guiding radiation.

FIG. 17 shows a further embodiment of a video wall 1 in a partial cross section, wherein, in this embodiment, the optical element 9 is configured in order to guide the emitted electromagnetic radiation of the components 2. In this case, the optical element 9 comprises lenses 24. The optical element 9 can comprise a carrier plate 25 in which the individual lenses 24 are formed. Any other type of holder for the lenses 24 can also be provided instead of the carrier plate 25. The optical element 9 is provided with retaining pins 10 which are fastened in retaining recesses 11, as explained above. The optical element 9 can be configured, for example, as an injection-molded part. The optical element 9 can be configured as a lens array.

Figure 18:
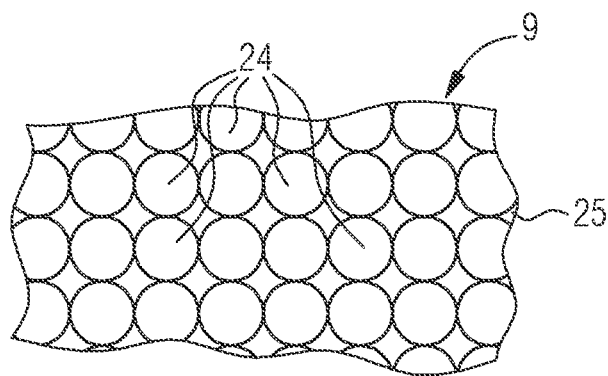
FIG. 18 shows a schematic partial detail of a plan view of the optical element of FIG. 17.

FIG. 18 shows a schematic plan view of the arrangement of FIG. 17. In this case, the individual lenses 24 are associated, for example, with a structural element, that is to say an image pixel, in each case. Depending on the selected design, a lens 24 can also be associated with a plurality of structural elements.

Figure 19:
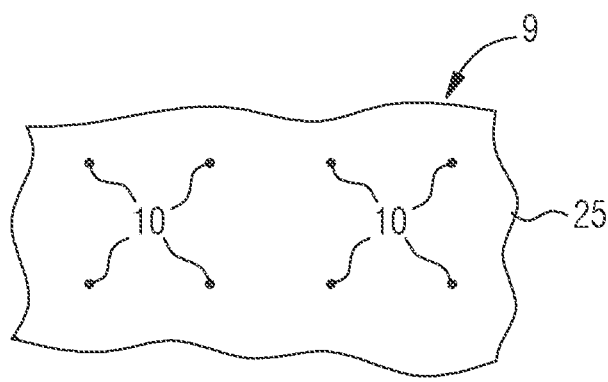
FIG. 19 shows a schematic illustration of a partial detail of a bottom side of the optical structural element of FIG. 17.

FIG. 19 shows a partial view of the optical element 9 of FIG. 18 from below, wherein the carrier plate 25 and the retaining pins 10 can be seen.

Figure 20:
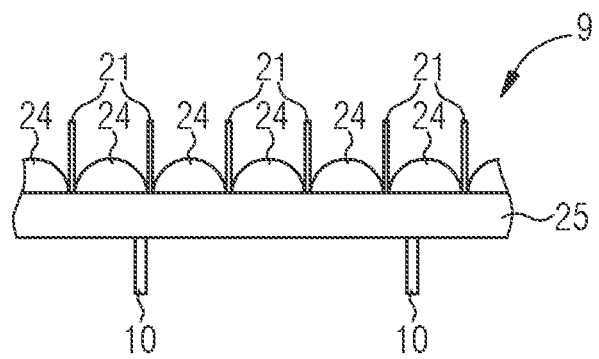
FIG. 20 shows a schematic partial cross section through a further embodiment of an optical element.

FIG. 20 shows a schematic partial cross section through a further embodiment of an optical element 9 which comprises a carrier plate 25, lenses 24 and additionally shading elements 21. Therefore, a combination of the shading elements 21 and the lenses 24 is provided. Therefore, firstly the light irradiation onto the video wall can be shaded and secondly a desired beam shaping of the electromagnetic radiation emitted by the structural elements can be achieved. Another type of holder, for example, a carrier frame, can also be used instead of the carrier plate 25. In addition, the lenses and the shading elements can be configured as self-supporting parts.

A basic idea of the proposed module for a video wall 1 with optical elements 9 is that space for retaining recesses 11 is created by removing a component recess 18 from the housing of the component 2. This is also possible with the components 2 at a lateral distance in relation to one another which is smaller than the diameter of the retaining pins 10. In particular, forming the retaining recesses 11 in the corner regions of the components is appropriate on account of the small component recesses 18 of the individual components. However, as already mentioned, the retaining recess can also be arranged in the region of the side faces 20 of the components 2.

Although the invention has been described and illustrated in detail by the preferred exemplary embodiment, the invention is not limited by the disclosed examples and other variations can also be derived by a person skilled in the art without departing from the scope of protection of the invention.

The invention claimed is:

1. A module for a video wall comprising:
   a carrier;
   a plurality of components comprising at least one light-emitting structural element arranged on the carrier; and
   an optical element,
   wherein the components are arranged at a prespecified lateral distance in relation to one another,
   wherein a retaining recess is located between at least two components,
   wherein the retaining recess comprises at least two component recesses of two components which are arranged next to one another,
   wherein a retaining pin is fastened in the retaining recess,
   wherein the retaining pin is connected to the optical element, and
   wherein the optical element is configured to influence light irradiation onto the components and/or light emission from the components.

2. The module according to claim 1, wherein the retaining recess extends into the carrier.

3. The module according to claim 1, wherein the retaining pin is connected to the retaining recess in a force-fitting and/or interlocking manner.

4. The module according to claim 1, wherein the retaining recess is arranged in corner regions of four components which are adjacent to one another, and wherein the retaining recess is formed by at least component recesses of the four components.

5. The module according to claim 1, wherein the component recesses are configured in form of bevels of the components.

6. The module according to claim 1, wherein the carrier comprises a circuit board with electrical lines and/or electrical circuits, and wherein the components are arranged on the circuit board.

7. The module according to claim 1, wherein the module comprises a plurality of retaining recesses, wherein a plurality of retaining pins are inserted into the retaining recesses, wherein the retaining pins are connected to the optical element, and wherein the optical element covers the components.

8. The module according to claim 1, wherein the optical element comprises at least one shading element for at least one structural element, and wherein the shading element is configured to reduce irradiation of light onto the structural element.

9. The module according to claim 8, wherein the at least one shading element is arranged in a manner inclined at an angle not equal to 90° with respect to a plane of the structural element.

10. The module according to claim 8, wherein the shading element comprises metal.

11. The module according to claim 1, wherein the optical element comprises at least one radiation-guiding element for the electromagnetic radiation of at least one structural element, and wherein the radiation-guiding element comprises a lens.

12. The module according to claim 11, wherein the radiation-guiding element is formed from plastic.

13. The module according to claim 1, wherein the component comprises an arrangement of a plurality of light-emitting structural elements which are arranged in a grid, and wherein one structural element comprises at least one light-emitting element.

14. The module according to claim 1, wherein the components are at a lateral distance of less than 0.8 mm.

15. The module according to claim 1, wherein the retaining pin comprises a diameter which is less than one millimeter.

16. The module according to claim 1, wherein the optical element comprises at least one shading element for at least one structural element, wherein the shading element is configured to reduce irradiation of light onto the structural element, wherein the optical element comprises at least one radiation-guiding element for the electromagnetic radiation of at least one structural element, and wherein the radiation-guiding element comprises a lens.

17. A module for a video wall comprising:
    a carrier;
    a plurality of components comprising at least one light-emitting structural element are arranged on the carrier; and
    an optical element,
    wherein the components are arranged at a prespecified lateral distance in relation to one another,
    wherein a retaining recess is located between at least two components,
    wherein the retaining recess comprises at least two component recesses of two components which are arranged next to one another,
    wherein a retaining pin is fastened in the retaining recess,
    wherein the retaining pin is connected to the optical element,
    wherein the optical element is configured to influence light irradiation onto the components and/or light emission from the components,
    wherein the retaining recess extends into the carrier,
    wherein the retaining recess is arranged in corner regions of four components which are adjacent to one another, and
    wherein the retaining recess is formed by at least component recesses of the four components.

18. A module for a video wall comprising:
    a carrier;
    a plurality of components comprising at least one light-emitting structural element are arranged on the carrier; and
    an optical element,
    wherein the components are arranged at a prespecified lateral distance in relation to one another,
    wherein a retaining recess is located between at least two components, wherein the retaining recess comprises at least two component recesses of two components which are arranged next to one another,
wherein a retaining pin is fastened in the retaining recess,
wherein the retaining pin is connected to the optical element,
wherein the optical element is configured to influence light irradiation onto the components and/or light emission from the components,
wherein the retaining recess extends into the carrier,
wherein the retaining recess is arranged in corner regions of four components which are adjacent to one another,
wherein the retaining recess is formed by at least component recesses of the four components,
wherein the carrier comprises a circuit board with electrical lines and/or electrical circuits, and wherein the components are arranged on the circuit board.

* * * * *